Figure 1:
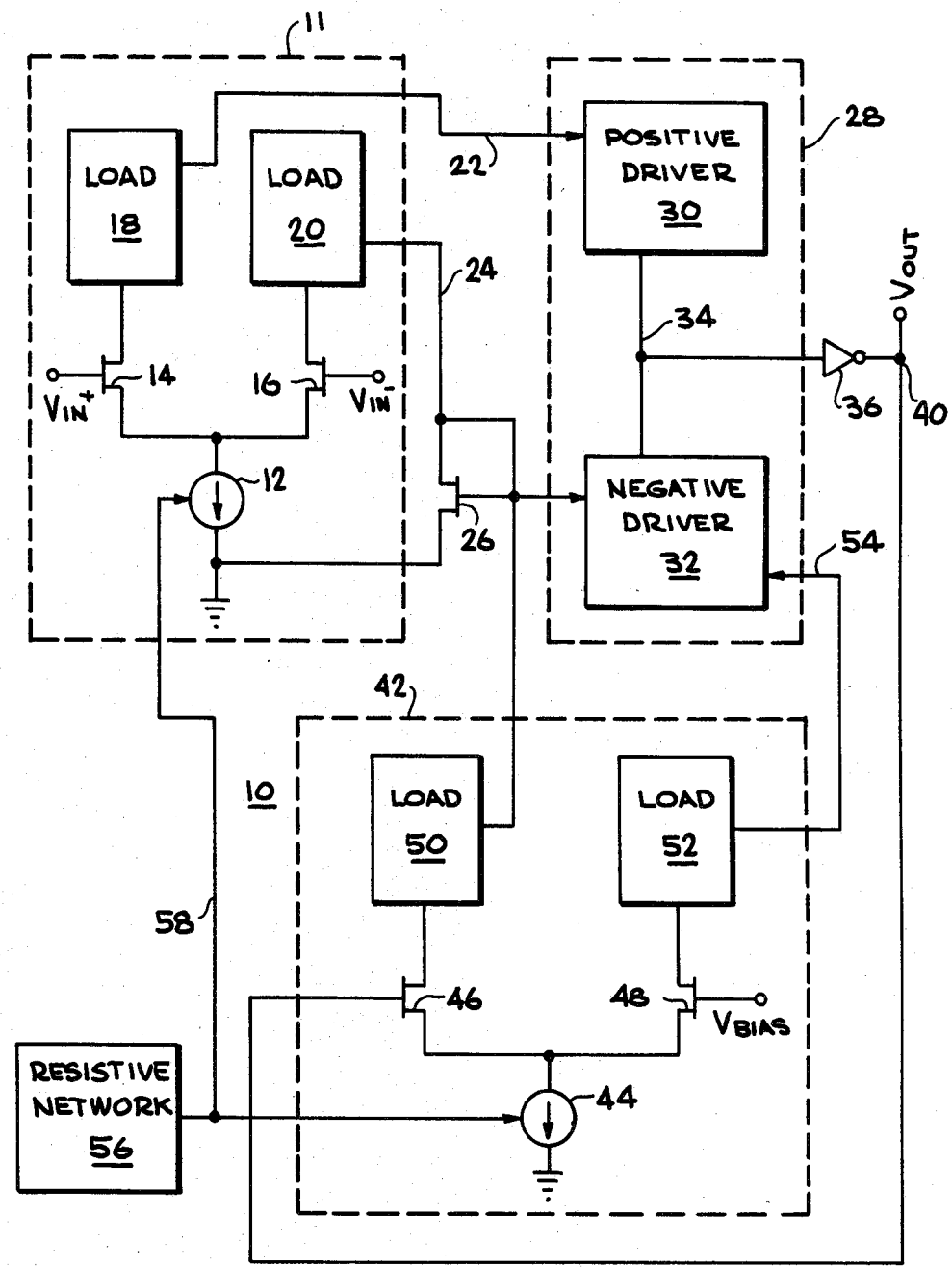

United States Patent [19]

De Weck

[11] Patent Number: 4,670,671

[45] Date of Patent: Jun. 2, 1987

[54] HIGH SPEED COMPARATOR HAVING CONTROLLED HYSTERESIS

[75] Inventor: Lionel M. De Weck, Santa Clara, Calif.

[73] Assignee: Advanced Micro Devices, Inc., Sunnyvale, Calif.

[21] Appl. No.: 831,039

[22] Filed: Feb. 19, 1986

[51] Int. Cl.⁴ .............................................. H03K 5/24
[52] U.S. Cl. .................................. 307/355; 307/359; 307/362
[58] Field of Search ............... 307/355, 362, 262, 261, 307/359; 330/255, 257

[56] References Cited

U.S. PATENT DOCUMENTS 4,335,358  6/1982  Hoeft .................................... 330/255
4,602,168  7/1986  Single .................................... 307/355

OTHER PUBLICATIONS

B. J. Hosticka, "Dynamic Amplifiers in CMOS Technology", Electronics Letters, vol. 15, No. 25, Dec. 6, 1979, pp. 814–820.

Primary Examiner—John Zazworsky
Attorney, Agent, or Firm—Patrick T. King; Davis Chin

[57] ABSTRACT

A high speed two micron CMOS comparator uses an input differential stage having feedback current mirror loads providing high speed current signals to an output cascode stage. Current mirror arrangement provide fast signal propagation through the comparator. Hysteresis is established by the output of the comparator positively fedback through a similar feedback differential stage superimposing controlled current signals into the cascode stage. Hysteresis of the output signal respecting a differential input signal is controlled by the ratio of bias currents of internal current sources which ratio is relatively insensitive to temperature changes.

11 Claims, 2 Drawing Figures

4,670,671

HIGH SPEED COMPARATOR HAVING CONTROLLED HYSTERESIS

CROSS REFERENCE

Cross reference is here made to applicant's copending patent applications entitled "High Speed Operational Amplifier" Ser. No. 831,020 filed on: 2/19/86, and "High Speed Full Differential Amplifier with Common Mode Rejection" Ser. No. 831,012, filed on: 2/19/86.

BACKGROUND

The present invention relates to electronics and electronics circuits. More specifically, the present invention relates to amplifier electronic circuits and comparator electronic circuits.

A comparator is generally considered to be a differential input electronic device having an output which toggles between a high and low output signal level depending upon a comparison between two input differential signals. The output signal will obtain one of two discrete states depending on which input signal has a higher voltage signal in comparison to the other input signal.

The comparator is supplied power by a positive power reference e.g. five volts DC, and a negative power voltage reference e.g. zero volts DC. The output signal will toggle between a voltage signal that approaches the positive power reference and another voltage signal that approaches the negative power reference.

The comparator includes an amplifier stage amplifying the voltage difference between the input differential signals. The output signal toggles between high and low output signals because of the high gain of the amplifier stage. The comparator can be considered to be an amplifier operating in an open loop configuration, that is without negative feedback controlling the linear operation of the amplifier. Hence, the comparator digitally operates without the need for compensation capacitors typically, used to control linear amplification through the unity gain bandwidth of the amplifier.

The difference between the input signals is amplified by the amplifying stage internal to the comparator which then provides an amplified output signal. The amplifier stage has a large gain so that a relatively small differential input signal, e.g. one microvolt, will cause the output of the comparator to approach one of the power references.

Typical differential amplifier designs include a differential input stage, which is a gain stage, connected to an output gain stage. The gain of the differential amplifier is the product of the gain of the differential input stage and the gain of the output gain stage.

One problem associated with conventional two stage voltage gain amplifiers are parasitic effects in which large varying voltage signals produce current flow in parasitic capacitance thereby reducing the bandwidth of the amplifier and thereby increasing power consumption. Hence, amplifiers which operate on internal voltage signals with large amplitude variation tend to have lower slew rates and bandwidths. Hence, conventional two stage amplifier internal to comparators have a substantially limited operating frequency with increased power dissipation.

Hysteresis, which acts to retard rapid toggling of the output signals has been a feature long embedded into comparators. Typically, the hysteresis is measured by that minimum voltage change which must be exceeded to the cause toggling of the output signal immediately subsequent to a prior toggling. The hysteresis function is better understood by way of two examples. In a first example, once the input voltage of one different input increases above the other causing an output toggling, that input voltage must decrease below the other by at least a hysteresis value, e.g. ten millivolts, before the output will toggle back to the original output level.

In the second example, once the input voltage of one differential input decreases below the other causing an output toggling, that input voltage must increase by at least a hysteresis value, e.g. ten millivolts, before the output will toggle back to the original output level.

Hysteresis in comparator has been used to prevent erratic oscillations of the output signal when the two input signal are approximate to each other. For example, in a comparator without hysteresis, when two input signal are approximate to each other, the output will obtain a given level, but, the output may oscillate in an erratic manner if unwanted superimposed noise signal is present on one of the input signal. In this example, if the comparator has a hysteresis value, then the unwanted superimposed noise signal would have to be larger than the hysteresis value in order to cause the aforementioned erratic oscillations. Hence, in this example, hysteresis in a comparator is used to prevent erratic unwanted oscillations due to unwanted superimposed noise.

Those skilled in the art well appreciate the various beneficial effects of hysteresis in comparators. An example of a commercial comparator is that provided by MOTOROLA Inc. part number MC14574 using P channel and N channel enhancement MOS devices in a single monolithic integrated electronic circuit. One problem associated with conventional comparators is the precision at which the hysteresis value is maintained through varying temperature and power supply references.

Designers of comparator and amplifier circuits have strived to continually increasing the speed of the comparator circuits while controlling the hysteresis and while limiting the power consumption of the circuits. The speed, hysteresis and power consumption features of the amplifier and comparator circuits are improved upon using the herein disclosed invention.

SUMMARY

An object of the present invention is to provide a high speed low power comparator circuit using feedback current mirror loads in an input differential stage.

Another object of the present invention is to provide a comparator circuit having hysteresis established by feedback through a feedback differential stage having feedback current mirror loads.

Yet another object of the present invention is to provide a comparator circuit having controlled hysteresis with relative insensitivity to temperature changes.

The present invention including various improved features, is embodied in a high speed comparator fabricated by a two micron CMOS process. The comparator with improved performance characteristics may be used in a wide variety of circuit applications.

The comparator comprises an input differential stage having feedback current mirror loads providing two outputs presented to an output cascode stage. The input differential stage and the cascode output stage combine forming a single gain stage.

The use of feedback current mirrors as active loads in the input differential stage provide current source outputs which are relatively insensitive to second order effect of superimposed voltage levels at their output thereby propagating fast current signals in the current domain to the transistors of the cascode output stage. Large internal voltage variations are avoided using current mirror arrangements improving the speed of the comparator.

The single gain stage structured by combining the input differential stage having current domain output signals, and the cascode output stage extends the operating frequency of the comparator. The comparator has a 150 nanosecond one percent settling time with a five millivolt overdrive at the inputs and a 250 nanosecond one percent settling time with a ten millivolt overdrive at the inputs.

The current domain operation relates to large current fluxion and small voltage fluxion internal to the comparator. The current domain operation of the comparator fabricated by CMOS process technology enables low power consumption. The comparator circuit operates primarily in the current domain while voltage signals primarily appear at high impedance terminals of all the transistors so that current and the corresponding power dissipation is used only upon demand thereby making the comparator power efficient dissipating about one milliwatt.

Hysteresis of the comparator is effectuated by the feedback differential stage also having feedback current mirror loads. This feedback differential stage, driven by the comparator output, positively feedsback current signals to the output cascode stage.

The hysteresis is established in part, by a resistive network internal to the comparator which is diffused into a monolithic substrate. The resistive network is used to set the current in two constant current sources each driving one of the two differential stages. The hysteresis is dependent upon the current ratio of the constant current sources which ratio is relatively insensitive to temperature variation because each is equally effected by temperature changes. The hysteresis is controlled to less than one thousand parts per million over the operating temperature range.

The comparator circuit provides improved performance characteristics and resulting advantages over heretofore comparator designs. These and other advantages will become more apparent from the following description of the preferred embodiment and from the accompanying drawings.

For further understanding of the herein disclosed invention, reference is made to applicant's copending patent applications entitled "High Speed Operational Amplifier" Ser. No. 831,020, filed on: 2/19/86, and "High Speed Full Differential Amplifier with Common Mode Rejection", Ser. No. 831,012, filed on: 2/19/86, both of which are here incorporated by reference as there fully set forth.

DRAWING DESCRIPTIONS

Figure 2:
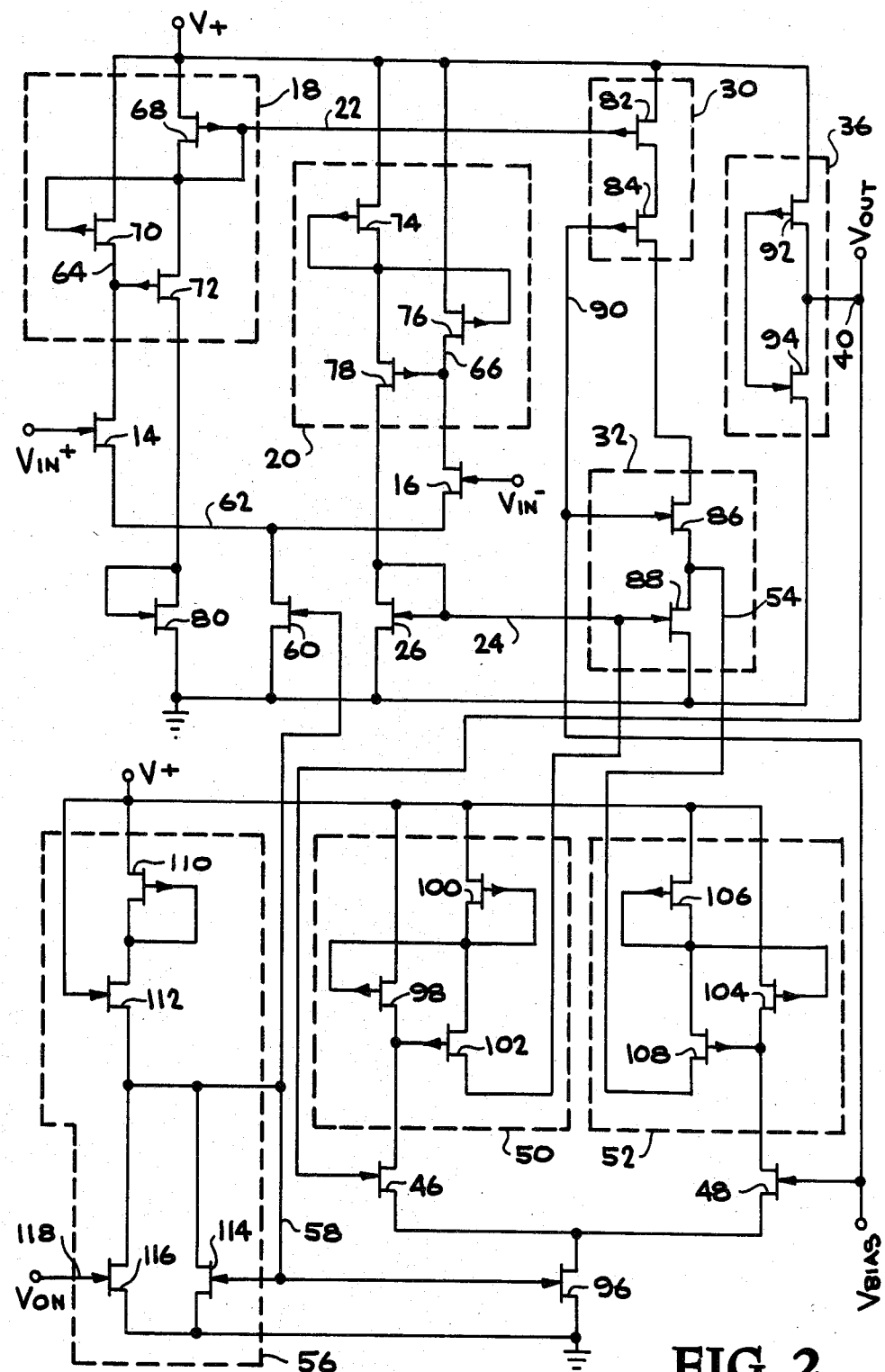

FIG. 1 is a block diagram of a high speed comparator.
FIG. 2 is a schematic diagram of the high speed comparator.

PREFERRED EMBODIMENT

Referring to FIG. 1, a comparator 10 amplifies a differential signal between a pair of input terminal Vin+ and Vin− and provides an output signal at an output terminal Vout. The output signal is equal to a gain value multiplied by the difference between the voltage applied to the Vin+ terminal minus the voltage applied to the Vin− terminal. Typically, the output signal toggles approximately between a power reference and a ground reference.

The comparator 10 has an input differential stage 11 comprising a constant current source 12, two coupled transistors 14 and 16 and two feedback current mirror loads 18 and 20. The current into the input terminals Vin+ and Vin− is negligible.

The constant current source 12 draws a constant current through the coupled transistors 14 and 16 which in turn draw the same constant current through the loads 18 and 20. The current through transistor 14 equals the current through the load 18 while the current through transistor 16 equals the current through the load 20.

The sum of the current flowing through transistors 14 and 16 equals the sum of the current flowing through loads 18 and 20 on lines 22 and 24, respectively, which sum equals to the constant current of the constant current source 12. As the voltage difference varies between the Vin+ terminal and the Vin− terminal, the current varies through the respective transistors 14 and 16, respective lines 22 and 24 and respective loads 18 and 20.

Both loads 18 and 20 provide a voltage and a current output signal. In this embodiment of the invention only two outputs are used even though others may be used. The load 18 has a voltage output on line 22. The load 20 has a current output on line 24 which is connected to a mirror transistor 26. The mirror transistor 26 is used to established a voltage signal also on line 24 corresponding to the current signal on line 24.

Voltage signals on lines 22 and 24 synchronously vary and are presented to an output cascode stage 28 comprising a positive driver 30 and a negative driver 32 inversely synchronously conducting current and connected together by line 34 which carries an output signal to an inverter 36. The cascode stage 28 and the input differential stage 11 combine for amplification of the differential voltage between input voltage signals on terminals Vin+ and Vin−. The inverter 36 presents an inverted output signal on line 40 which is connected to an output terminal Vout of the comparator 10.

In operation, coupled input transistors 14 and 16 cause current changes through loads 18 and 20 as the differential input voltage changes between the terminals Vin+ and Vin−. The loads 18 and 20 produce corresponding changing current and voltage signals which are presented to the cascode stage 28 which provides gain in combination with the loads 18 and 20. The loads 18 and 20 combine with the cascode stage 28 as a single gain stage.

Hysteresis, for example, in the order of ten millivolts, is provided in part by a feedback differential stage 42 also comprising a current source 44, two coupled transistors 46 and 48, and two feedback current mirror loads 50 and 52. The feedback differential stage 42 operates similar to the input differential stage 11.

In this embodiment, current signals from the loads 50 and 52 on respective lines 24 and 54 are used to effect current and voltage signal changes in the negative driver 32. The current signals from the loads 50 and 52 are used to establish a hysteresis in the comparator 10. The positive driver 30 with level shifting and conversion of the current signals from loads 50 and 52 may also be used to effect the positive feedback.

A positive feedback path is established by presenting the output voltage on line 40 to coupled transistor 46 which produces current signals from loads 50 and 52, through lines 24 and 54, respectively, which are in turn connected to the negative driver 32. A bias voltage reference is presented to the bias voltage terminal Vbias. The bias voltage reference applied to the coupled transistor 48 relatedly operates with the coupled transistor 46 perfecting current changes in loads 50 and 52 responsive to toggling voltage signals on line 40.

A resistive network 56 provides a voltage reference on line 58 for establishing bias currents through the current sources 12 and 44. The resistive network 56 conducts a bias current which is reflected to a predetermined extent in the constant current sources 12 and 44. The hysteresis of the comparator is dependent upon the ratio of the current through the two current sources 12 and 44. The hysteresis is relatively insensitive to temperature changes because the ratio of the two current sources 12 and 44 is stable with temperature changes by virtue of both changing correspondingly with temperature changes.

Referring to FIGS. 1 and 2, the comparator 10 is fabricated by a two micron CMOS process providing only two different types of transistors, P channel MOS enhancement field effect transistors and N channel MOS enhancement field effect transistors. Enhancement transistors conduct with an applied gate voltage causing an inversion conducting layer between the drain and source terminals of the transistors.

However those skilled in the art may readily appreciate the employment of different transistors, for example, depletion transistors which conduct current through a diffused conducting layer between the source and drain terminals without an applied gate voltage. Moreover, those skilled in the art may employ different process technologies to construct similar comparators which may represent different embodiments of the herein disclosed invention.

P and N channel transistors are distinguished by reference arrows placed at the gate terminals thereof. A N channel MOS transistor has an arrow directed toward the gate terminal while the P channel MOS transistor has an arrow directed away from the gate terminal. The source terminal of the transistor is that terminal which is closest connected to the positive power supply reference V+ for the P channel transistor or closest connected to the ground reference for the N channel transistors.

The preferred embodied comparator 10 was diffused in a monolithic silicon die providing bulk terminals of the transistors. Generally, the bulk terminals are normally connected to the source terminal as is standard practice in CMOS designs.

The discussions herein relating to circuits fabricated in one particular process may well be equally applicable to a wide variety of processes, and more particularly to PMOS, NMOS, CMOS and bipolar processes, and equally applicable to differing devices such as junction field effect transistors, MOS enhancement field effect transistors, MOS depletion field effect transistors, or PNP and NPN bipolar transistors.

The current source 12 comprises a mirror transistor 60. The drain terminal of transistor 60 in connected to a line 62 which couples together the source terminals of input transistors 14 and 16. The feedback current loads 18 and 20 are respectively connected to the drain terminals of the input transistors 14 and 16, through lines 64 and 66. Each of feedback current loads 18 and 20 comprises a set of three interconnecting transistors, current path transistor 70, mirror transistor 68 and feedback transistor 72, and current path transistor 76, mirror transistor 74 and feedback transistor 78, respectively. In substantial similar operation, both loads 18 and 20 conduct current and voltage signals equally oppositely therethrough. As the current through one load increases, the current through the other decreases as an essential operation of the input differential stage 11.

The feedback feature of the current loads 18 and 20 reduces second order effects of voltage signals superimposed into the drain terminals of feedback transistors 72 and 78 thereby improving the speed throughout the comparator 10. A transistor 80 is used to provide the load 18 with a current load necessary for its conductive operation. Current mirror arrangements which have connected gate terminals of connected transistor disposed between the loads 18 and 20 and the cascode stage 28 provide for current domain operation characterized by large current fluxion when needed but with little voltage fluxion. Thus, the speed of the comparator is further increased by virtue of the current domain operation which is less susceptible to parasitic capacitance.

The current signals on line 24 is conducted through the current mirror transistor 26 which then provides the negative driver with a voltage signal. The current to voltage conversion of the mirror transistor 26 enables a voltage signal to be coupled to the negative driver 32 of the cascode stage 28.

The cascode stage 28 has four stacked transistors, a positive signal transistor 82, a positive pass transistor 84, a negative pass transistor 86 and a negative signal transistor 88, all of which are connected together in order in series between the positive power reference and the ground reference. Transistors 82 and 88 have varying voltage signals applied to their respective gate terminals.

The pass transistors 84 and 88 have a fixed bias voltage applied to their gate terminals through a line 90 which is connected to a bias voltage terminal Vbias. Dynamic biasing of the pass transistors 84 and 88 is typically unnecessary in digital operations because of a sufficient dynamic range of the output of the comparator 10.

Load 18 is the source of a voltage signal applied to positive signal transistor 82 while the load 20 is the source of a voltage signal applied to the negative signal transistors 88. As the current through load 18 increases and the current through load 20 correspondingly decreases, the voltage signal on lines 22 decreases and the voltage signal on lines correspondingly decreases, as the current through transistor 82 and 84 increases while the current through transistors 86 and 88 decreases. As the transistors 82 and 84 increasingly synchronously conduct, transistors 86 and 88 decreasingly synchronously conduct providing a decreasing signal on line 34. Likewise, an inverse equal but opposite operation occurs providing an increasing output signal on line 34.

The inverter 36 comprises two transistor 92 and 94 for inverting the voltage signal on line 34. The inverter 36 is of conventional two transistor inverter design and is well understood by those skilled in the art.

The speed of the comparator 10 is improved by the current domain operation of the input differential stage 11. The current signal provided by the load 20 is not converted to voltage signals except in connection with the cascode stage 28 and driver 32. Thus the comparator 10 only has one voltage gain stage between the input transistors and the output terminal.

The current mirror arrangements between the loads 18 and 20 and the cascode stage 28 enables fast operation with corresponding fast toggling of the output signal. Consequently, the herein disclosed embodiment approximately has a 250 nanosecond response time for a five millivolt overdrive signal between the input terminals Vin+ and Vin−.

Referring specifically to the feedback differential stage 42, the constant current through current source 44 is provided by a mirror transistor 96. The output terminal Vout of the comparator 10 and the bias voltage terminal Vbias are respectively connected to the gate input terminals of the coupling transistors 46 and 48. Transistor 46 draws current through load 50 comprising current path transistor 98, mirror transistor 100 and feedback transistor 102. Likewise, transistor 48 draws current through load 52 comprising current path transistor 104, mirror transistor 106 and feedback transistor 108.

As the output voltage on line 40 toggles at the output terminal Vout, the constant current correspondingly toggles through loads 50 and 52. Loads 50 and 52 are connected to lines 24 and 54 respectively, which are in turn respectively connected to the gate and drain terminal of transistor 88 of the negative driver 32 of the cascode stage 28.

In operation and by way of example, as the voltage on the Vin+ terminal exceeds the voltage on the Vin− terminal by a predetermined hysteresis voltage, the current through load 18 increases while the current through load 20 decreases. As the current through load 18 increases and the current through load 20 decreases, the voltage on line 22 decreases while the voltage on line 24 decreases. As the voltages on lines 22 and 24 synchronously decrease, the current through transistors 82 and 84 increases while the current through transistors 88 and 86 inversely decreases, thereby causing the voltage on line 34 to increase to the power reference V+ and thereby causing the voltage on line 40 to decrease to the ground reference.

As the voltage on line 40 decreases below the bias voltage Vbias on line 48, the current in load 50 decreases and the current through load 52 increases. A decreasing current in load 50 decreases the current through feedback transistor 102 thereby causing a further decrease in the current through transistor 88, and thereby causing a further decrease in the current through transistor 86. Simultaneously, the increasing current through load 52 and through feedback transistor 108 on line 54 provides an increasing current into the drain terminal of transistor 88. An increasing current on line 54 at the drain terminal of transistor 88 causes a corresponding decrease in the current through transistor 86 because the current through transistor 88 is limited by the voltage on line 24. Hence, load 50 provides a decrease in the current through transistor 86 while load 52 provides another decrease in the current through transistor 86. Thus, load 50 and 52 provide a double decreasing current effect in transistor 86. This double decreasing current effect establishes the extent of the hysteresis. The feedback current signals on line 24 and 54 causing the double decreasing current effect in transistor 86 further increases the speed of the toggle of the output characterizing positive feedback.

The positive feedback creating the hysteresis is established by the double decreasing current effect in the current though transistor 86 caused by loads 50 and 52. The input differential stage 11 caused a decrease in the current through 86 which produce a toggling output which caused currents in loads 50 and 52 to change correspondingly which further, that is positively, decreased the current through transistor 86.

In the above example, both loads 50 and 52 effect the double decreasing current effect in transistor 86. This double decreasing current effect provides for a rapid toggling of the output and establishes the amount of hysteresis provided by the feedback differential stage 42.

In further explanation by way of example and assuming that the differential input voltages remains where the voltage on the Vin+ terminal exceeded the voltage on the Vin− terminal by the hysteresis voltage, and then further assuming that voltage on Vin+ terminal starts to decrease, the voltage on the Vin+ terminal would have to decrease to that extent required for added current from load 20 on line 24 to counterbalance the double decreasing current effects of the loads 52 and 50 for there to be a subsequent toggling of the output signal. Thus, the hysteresis is established to the extent that the voltage on the Vin+ terminal must decrease relative to the voltage on the Vin− terminal, to counterbalance the doubling decreasing current effect of the current load 50 and 52.

It is the relationship between the current change in loads 18 and 20 and the double decreasing current of loads 50 and 52 that determines the amount of hysteresis. Hence, the ratio between the current sources 12 and 44 which drive loads 18 and 20, and 50 and 52, respectively, determines the amount of hysteresis, which ratio is relatively insensitive to temperature change changes because both current sources 12 and 44 change correspondingly with temperature change.

Once the output has toggled because of an increased or decreased differential input voltage, the input differential voltage must decrease or increase, respectively, a predetermined hysteresis voltage for the comparator to toggle again by counter-balancing the double decreasing current effect of loads 50 and 52 upon the pass transistor 86. It is the positive feedback of changing current through loads 50 and 52 upon the driver 32 that establishes the hysteresis. However, through shifting, converting and communicating signals with other transistors, the positive driver 30 can also be used to perfect positive feedback and hysteresis in a like manner.

The resistive network 56 establishes a bias voltage on line 58. The resistive network comprises three transistors 110, 112 and 114 connected in series between the power reference V+ and the ground reference. The bias voltage is determine by the resistive division of the source to drain resistances of the three transistors 110, 112 and 114.

A shunt transistor 116 having its drain terminal connected to line 58, is used to turn off transistor 114 and used to shunt the bias voltage on line 58 to the ground reference thereby shutting off the constant current sources 12 and 44 and thereby shutting off the comparator 10.

The comparator 10 can be disabled providing system designs with means to automatically enable or disable the comparator 10. Hence, the operating current of comparator is externally programmed with an external voltage reference at a terminal Von connected the gate terminal of the shunt transistor 116 through a current bias input line 118 so as to provide system designs with means to selectively enable various comparators.

The herein disclosed invention encompasses a high performance comparator enabling high speed, low power, controlled hysteresis comparisons. Even though, those skilled in the art may invent and conceive differing circuit and comparator designs and modifications, those designs and modifications may nevertheless represent applications and principles within the spirit and scope of the present invention as defined by the following claims.

What is claimed is:

1. A comparator circuit comparing a pair of differential inputs and providing a digital output, comprising:
   current source means providing a source of current,
   a pair of coupled transistor means for respectively receiving said differential inputs, said coupled transistor means connected to said current source means for conducting said current,
   a pair of feedback current mirror means each for conducting a pportion of said current, said feedback current mirror means providing first and second signals responsive to said differential inputs and respectively connected to said pair of coupled transistor means,
   cascode stage means for receiving said first and second signals and for providing said digital output, said cascode stage means having a first and second portion inversely synchronously conducting current and respectively receiving one of said first and second signals, said first signal and said second signal synchronously changing respecting the other, and
   feedback differential stage means for receiving said digital output and for providing a positive feedack signal to said first or second portion of said cascode stage means inducing a hysteresis between said inputs and said digital output.

2. The comparator circuit of claim 1 wherein said feedback differential stage comprises
   a second current source means providing a second source of current,
   a second pair of coupled transistor means for receiving said output and a bias reference, said second pair coupled transistor means connected to said second current source means for conducting said current of said second current source means,
   a second pair of feedback current mirror means each for conducting a portion of said current of said second current source means, said second pair of feedback current mirror means respectively connected to said second pair of coupled transistor means and providing signals responsive to said digital output and said bias reference.

3. The comparator circuit of claim 2 wherein each of said feedback current mirror means comprises,
   current path transistor means connected to one of either of said first or second pair of coupled transistor means for conducting said portion of said current of either of said first or second current source means,
   current mirror transistor means connected to said current path transistor means for conducting current equal to the current through said current path transistor means, and
   feedback transistor means for providing said first and second signals or providing said signals responsive to said digital output and said bias reference, said feedback transistor means connected to said current mirror transistor means and conducting the current through said current mirror transistor means, said feedback transistor means providing a feedback signal to said current path transistor means.

4. The comparator of claim 1 wherein said cascode stage means comprises
   a first pair of transistor means receiving said first signal, said first pair of transistor means connected in series, and
   a second pair of transistor means receiving said second signal, said second pair of transistor means connected in series.

5. The comparator of claim 4 wherein each of said first and second pair of transistor means comprises
   a statically biased pass transistor means responsive to a bias reference, and
   a signal transistor means each responsive to a respective one of said first and second signals.

6. A comparator circuit comparing a pair of differrential inputs and providing a digital output, comprising:
   first current source means providing a first constant current,
   first pair of coupled transistor means each respectively receiving one of said differential inputs, said first pair of coupled transistor means connected to said first current source means, each of said first pair of coupled transistor means for conducting a portion of said constant current through said first current source means in response to said differential inputs,
   first pair of feedback current mirror means each for respectively conducting said portion of said constant current of said first current source means through a connection to a respective one of said first pair of coupled transistor means, said first pair of feedback means providing first and second signals responsive to said differential inputs,
   mirror stage means for coupling said first and second signals from first pair of said feedback current mirror means to cascode stage means,
   said cascode stage means for receiving said first and second signals from said mirror stage means and for providing said digital output, said cascode stage means having a first and second portion inversely conducting current and respectively receiving one of said first and second signals, said first signal and said second signal synchronously changing respecting the other, each of said first and second signals driving a respective one of said first and second portions of said cascode stage means,
   inverter stage means for inverting said digital output and providing an inverted digital output,
   second current source means providing a second constant current,
   second pair of coupled transistor means each respectively receiving said inverted digital output and a bias reference, said second pair of coupled transistor means connected to said second current source means, each of said second pair of coupled transistor means for conducting a portion of said second constant current of said second constant current source means in response to the difference between said inverted digital output and said bias reference, and second pair of feedback current mirror means each for respectively conducting said portion of said second constant current of said second constant current source means through connection to a respective one of said second pair of coupled transistor means, said second pair of feedback means providing signals responsive to said inverted digital output and said bias reference, said second pair of feedback current mirror means providing positive feedback signal to said cascode stage, said positive feedback signals serving to induce hystersis between said differential inputs and said inverted digital output.

7. The comparator circuit of claim 6 further comprising resistive network connected to said first and second current source means for respectively establishing said first and second constant current in said first and second current source means.

8. The comparator circuit of claim 6 wherein said cascode stage means comprises
    a first pair of transistor means for providing a first portion of an output signal at said digital output, said first pair of transistor means connected in series between said output and a first power supply reference supplying current and power therethrough, at least one of said first pair of transistor means receiving a respective one of said first and second signals producing synchronously changing current through said first pair of transistor means, and
    a second pair of transistor means for providing a second portion of said output signal at said digital output, said second pair of transistor means connected in series between said digital output and a second power supply reference supplying current and power therethrough, at least one of said second pair of transistor means receiving a respective one of said first and second signals producing inversely synchronously changing current through second pair of transistor means, said first signal and said second signal synchronously changing respecting the other providing said digital output.

9. The comparator circuit of claim 8 wherein each of said first and second pair of transistor means comprises,
    signal transistor means for receiving a respective one of said first and second signals, said signal transistor means connected to one of either of said first and second power supply references, and
    pass transistor means for receiving said bias reference and for passing said respective one of said first and second signals, said pass transistor means connected between said signal transistor means and said digital output.

10. A method of comparing differential input signals comprising the steps of,
    determining the difference between the differential input signals,
    conducting respective portions of a first constant current through a first pair of feedback current mirror loads in response to the difference between the differential input signals,
    generating synchronously changing signals from said feedback current mirror loads,
    driving a cascode stage with said synchronously changing signals from said feedback current mirror loads, said cascode stage inversely conducting current providing a digital output,
    inverting said digital output for providing an inverted digital output,
    determining the difference between the inverted digital output and a bias reference,
    conducting respective portions of a second constant current through a second pair of feedback current mirror loads in response to the difference between the inverted digital output and the bias reference to provide positive feedback signals; and
    further driving said cascode stage with said positive feedback signals serving to induce hysteresis between said differential input signals and said inverted digital output.

11. The method of producing an output signal of claim 10, further comprising the step of setting the ratio between said first and second constant current sources predetermining the magnitude of said hysteresis.

* * * * *